United States Patent
Hwang et al.

(10) Patent No.: US 9,583,648 B2
(45) Date of Patent: Feb. 28, 2017

(54) SOLAR CELL

(71) Applicant: LG ELECTRONICS INC., Seoul (KR)

(72) Inventors: Sunghyun Hwang, Seoul (KR); Jinsung Kim, Seoul (KR); Hyunho Lee, Seoul (KR); Haejong Cho, Seoul (KR); Donghae Oh, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 0 days.

(21) Appl. No.: 14/795,749

(22) Filed: Jul. 9, 2015

(65) Prior Publication Data

US 2016/0013334 A1    Jan. 14, 2016

(30) Foreign Application Priority Data

Jul. 9, 2014   (KR) .................. 10-2014-0086344

(51) Int. Cl.
*H01L 31/00*    (2006.01)
*H01L 31/0224*  (2006.01)
*H01L 31/05*    (2014.01)
*H01L 31/068*   (2012.01)

(52) U.S. Cl.
CPC .. *H01L 31/022425* (2013.01); *H01L 31/0504* (2013.01); *H01L 31/0508* (2013.01); *H01L 31/068* (2013.01); *Y02E 10/50* (2013.01)

(58) Field of Classification Search
USPC .................................. 136/243–293
See application file for complete search history.

(56) References Cited

U.S. PATENT DOCUMENTS

| | | | |
|---|---|---|---|
| 2008/0216887 A1* | 9/2008 | Hacke ............... | H01L 31/0516 136/244 |
| 2009/0020158 A1* | 1/2009 | Ohtsuka ............. | H01L 21/2254 136/261 |
| 2012/0152338 A1* | 6/2012 | Ha ..................... | H01L 31/02168 136/255 |

FOREIGN PATENT DOCUMENTS

JP       2007-287861    * 11/2007    ............ H01L 31/04

* cited by examiner

*Primary Examiner* — Thanh-Truc Trinh
(74) *Attorney, Agent, or Firm* — Birch, Stewart, Kolasch & Birch LLP

(57) ABSTRACT

A solar cell includes a substrate of a first conductive type, a plurality of first electrodes positioned on one surface of the substrate in parallel with one another, and a plurality of back surface field regions which are positioned respectively correspondingly to the plurality of first electrodes, are separated from one another, and are doped with impurities of the first conductive type at a concentration higher than the substrate. Each back surface field region includes discontinuous regions in a longitudinal direction of the first electrodes. An impurity concentration of the discontinuous regions is lower than an impurity concentration of the back surface field region.

16 Claims, 18 Drawing Sheets

SOLAR CELL

CROSS-REFERENCE TO RELATED APPLICATION

This application claims priority to and the benefit of Korean Patent Application No. 10-2014-0086344 filed in the Korean Intellectual Property Office on Jul. 9, 2014, the entire contents of which are incorporated herein by reference.

BACKGROUND OF THE INVENTION

Field of the Invention

Embodiments of the invention relate to a solar cell, in which a heavily doped region is locally formed.

Description of the Related Art

A solar cell is a power generating device obtaining photovoltaic power using a photoelectric effect and collects electrons and holes produced in a semiconductor substrate forming a p-n junction through an n-type electrode and a p-type electrode. Further, the solar cell includes a back surface field region forming a potential barrier between the semiconductor substrate and the electrodes, and the back surface field region is formed by heavily doping impurities of the same conductive type as the semiconductor substrate.

The back surface field region is generally formed through a semiconductor process such as a thermal diffusion method and an ion injection method. In recent times, the back surface field region may be more precisely formed through a heavily doped region with the development of an ion implantation method as an example of an ion injection method.

SUMMARY OF THE INVENTION

Embodiments of the invention relate to a solar cell, in which a back surface field region is locally formed.

In one aspect, there is a solar cell including a substrate of a first conductive type, a plurality of first electrodes positioned on one surface of the substrate in parallel with one another, and a back surface field region positioned correspondingly to the plurality of first electrodes, separated from one another, and doped with impurities of the first conductive type at a concentration higher than the substrate, wherein the back surface field region includes discontinuous regions in a longitudinal direction of the first electrodes, wherein an impurity concentration of the discontinuous regions is lower than an impurity concentration of the back surface field region.

The impurity concentration of the discontinuous region may be the same as an impurity concentration of the substrate.

The impurity concentration of the discontinuous regions may have a Gaussian distribution, in which left and right sides of the discontinuous regions are symmetric to each other.

A width of the back surface field region may be two to five times a width of the first electrodes and may be less than a pitch of the first electrodes.

The solar cell may further include a plurality of second electrodes positioned in a direction crossing the first electrodes and configured to have a width greater than the first electrodes. The discontinuous regions may be positioned at crossings of the first electrodes and the second electrodes.

A width of the discontinuous regions may be equal to or greater than the width of the second electrodes.

The discontinuous regions may include a first discontinuous regions positioned at the crossings and a second discontinuous regions positioned between the adjacent crossings.

A width of the first discontinuous regions may be greater than a width of the second discontinuous regions.

The solar cell may further include second electrodes positioned in a direction crossing the first electrodes and configured to have a width equal to or greater than the first electrodes, and pads selectively positioned at crossings of the first electrodes and the second electrodes. The discontinuous regions may be positioned opposite the pads.

A width of the pads in the longitudinal direction of the first electrodes may be equal to or less than a width of the discontinuous regions in the longitudinal direction of the first electrodes.

Each first electrode may include a disconnection portion, in which a first electrode is not formed. The discontinuous regions may include first discontinuous regions positioned opposite the pads and second discontinuous regions positioned opposite the disconnection portions.

In another aspect, there is a solar cell module including a plurality of solar cells each including a substrate of a first conductive type, a plurality of first electrodes positioned on a front surface of the substrate, and a plurality of second electrodes positioned on a back surface of the substrate, and a plurality of wiring members configured to connect the plurality of first electrodes of a first solar cell among the plurality of solar cells to the plurality of second electrodes of a second solar cell adjacent to the first solar cell, wherein each of the plurality of solar cells includes a back surface field region, which is positioned correspondingly to the plurality of second electrodes, is separated from one another, and is doped with impurities of the first conductive type at a concentration higher than the substrate, wherein the back surface field region includes discontinuous regions selectively positioned at crossings of the plurality of wiring members and the first and second electrodes, wherein an impurity concentration of the discontinuous regions is lower than an impurity concentration of the back surface field region.

A plurality of pads may be selectively positioned in the discontinuous regions and increase an area of crossings of the plurality of wiring members and the plurality of second electrodes.

Each of the plurality of solar cells may include a plurality of connection electrodes configured to connect the plurality of pads in a longitudinal direction of the wiring members. A width of the discontinuous regions positioned correspondingly to the connection electrode may be the same as a width of the discontinuous regions positioned correspondingly to the pads.

A number of discontinuous regions based on one of the plurality of wiring members may be equal to or more than a number of pads based on the one wiring member and may be equal to or less than a total number of second electrodes.

A total number of discontinuous regions may be equal to or less than a total number of crossings of the second electrodes and the wiring members.

The plurality of wiring members may be divided into wiring members positioned opposite the discontinuous regions and wiring members, which are not opposite to the discontinuous regions.

A ratio of a minimum number of wiring members, which are not opposite to the discontinuous regions, to a total number of wiring members may be 0.2 to 0.4.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE EMBODIMENTS

Reference will now be made in detail to embodiments of the invention, examples of which are illustrated in the accompanying drawings. This invention may, however, be embodied in many different forms and should not be construed as limited to the embodiments set forth herein. Wherever possible, the same reference numbers will be used throughout the drawings to refer to the same or like parts. It should be noted that a detailed description of known arts will be omitted if it is determined that the detailed description of the known arts can lead to misconstruing of the embodiments of the invention.

Example embodiments of the invention will be described with reference to FIGS. 1 to 22.

Figure 1:
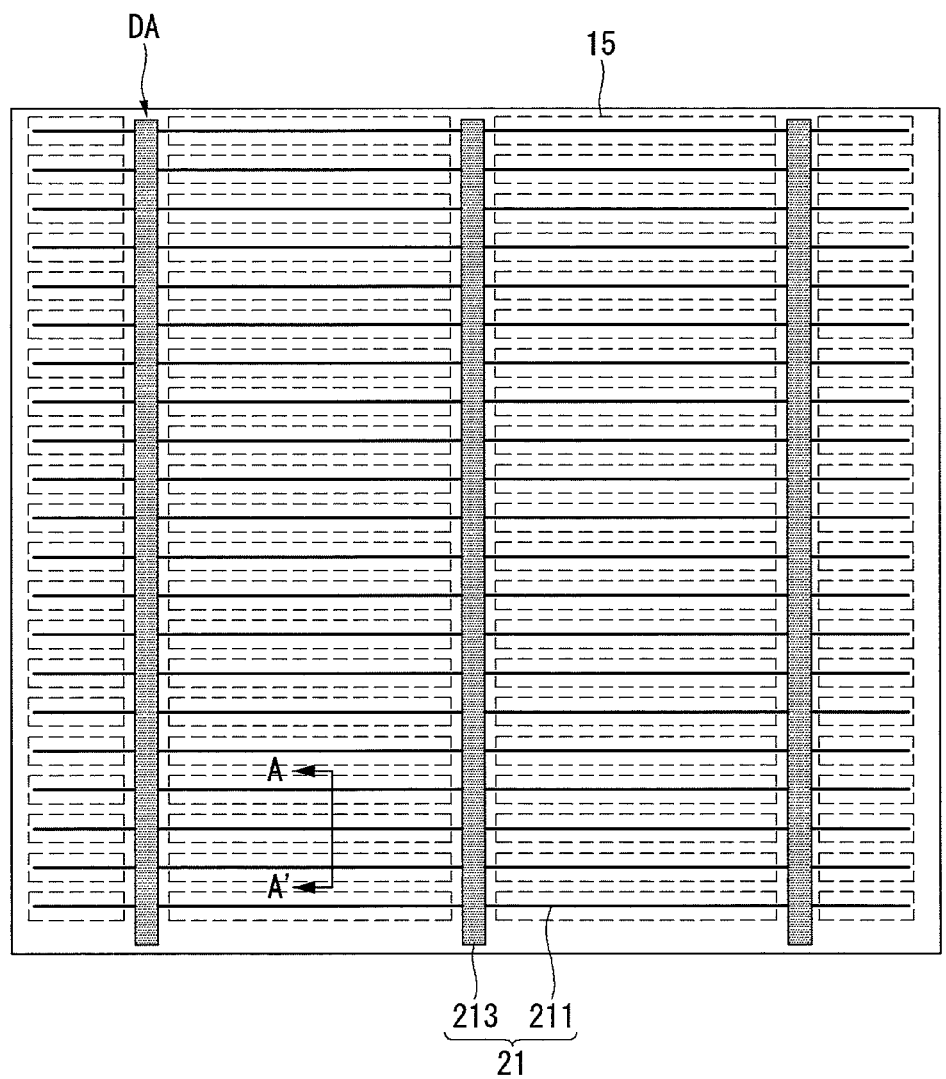
FIG. 1 shows a configuration of a back surface of a solar cell according to an example embodiment of the invention.
Figure 2:
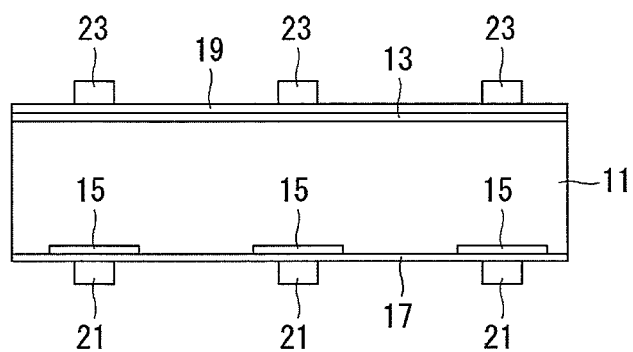
FIG. 2 is a cross-sectional view taken along line A-A' of FIG. 1.

FIG. 1 shows a configuration of a back surface of a solar cell according to an example embodiment of the invention, and FIG. 2 is a cross-sectional view taken along line A-A' of FIG. 1.

The solar cell according to the embodiment of the invention is a bifacial solar cell and may receive light through both a front surface and a back surface of the solar cell. In a typical bifacial solar cell, an electrode structure of the front surface and an electrode structure of the back surface are the same as each other.

The solar cell according to the embodiment of the invention includes a first conductive type semiconductor substrate 11 and an emitter region 13 forming a p-n junction along with the semiconductor substrate 11. The emitter region 13 includes impurities of a second conductive type opposite the first conductive type at a high concentration. For example, if the semiconductor substrate 11 is of an n-type, the emitter region 13 may be of a p-type. In this instance, the emitter region 13 may be formed by injecting boron (B) as an example of the impurities into the surface of the semiconductor substrate 11.

A region 15 (hereinafter referred to as "back surface field region 15"), which is more heavily doped than the semiconductor substrate 11 with impurities of the same conductive type as the semiconductor substrate 11, is locally formed at a back surface of the semiconductor substrate 11. The back surface field region 15 of the same conductive type as the semiconductor substrate 11 may be of the n-type if the semiconductor substrate 11 is of the n-type. In this instance, the back surface field region 15 may be formed by injecting phosphorus (P) as an example of the impurities into the back surface of the semiconductor substrate 11. Preferably, the back surface field region 15 may be locally formed by implanting impurities into the back surface of the semiconductor substrate 11 through an ion implantation method.

A potential barrier is formed by a difference between impurity concentrations of the semiconductor substrate 11 and the back surface field region 15 and prevents or reduces carriers of the same conductive type as the semiconductor substrate 11 from moving to the back surface of the semiconductor substrate 11. Hence, the back surface field region 15 may prevent or reduce a recombination and/or a disappearance of carriers of different conductive types at and around the surface of the semiconductor substrate 11.

The back surface field region 15 is not formed at the entire back surface of the semiconductor substrate 11 and is formed at a portion of electrodes. This is described with reference to the drawings.

A back passivation layer 17 covers the entire back surface of the semiconductor substrate 11. The back passivation layer 17 may be formed of a silicon material such as silicon nitride (SiNx), silicon oxide (SiOx), and silicon oxynitride (SiNxOy).

A collection electrode 21 is formed on a back surface of the back passivation layer 17. In the embodiment of the invention, the collection electrode 21 includes finger electrodes 211, which are disposed in a horizontal direction and collect carriers, and bus electrodes 213, which electrically connect the finger electrodes 211 in a vertical direction and transfer the carriers collected by the finger electrodes 211 to the outside.

The finger electrodes 211 are formed on the back surface field region 15, so as to efficiently collect carriers. A width of the finger electrodes 211 is less than a width of the bus electrodes 213. Hence, when the bus electrodes 213 connect the finger electrodes 211, the bus electrodes 213 reduce a line resistance and make it easier to transfer the carriers.

A front passivation layer 19 and a front electrode 23 are formed on the front back surface of the semiconductor substrate 11 in the same manner as the back passivation layer 17 and the collection electrode 21 on the back surface of the semiconductor substrate 11.

Figure 3:
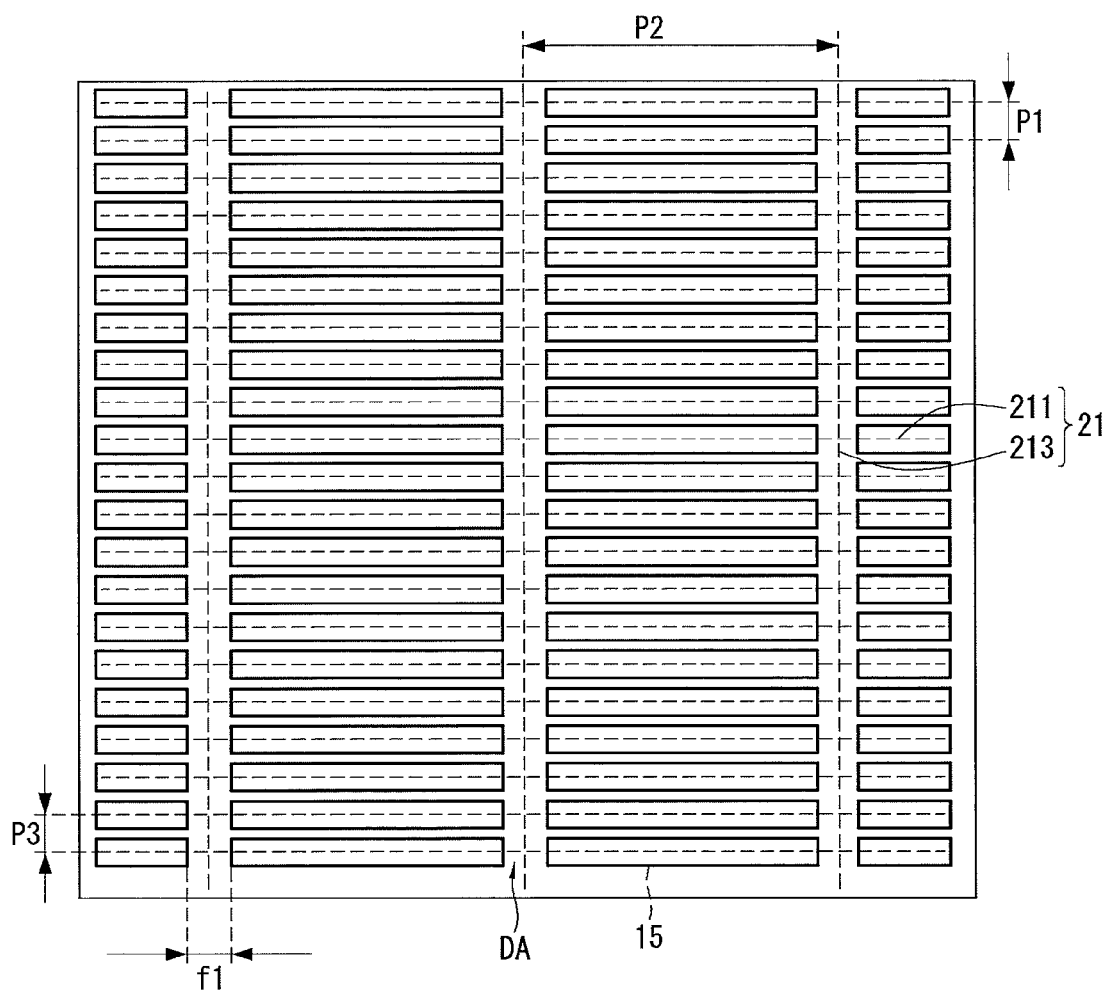
FIG. 3 selectively shows a back surface field region.
Figure 4:
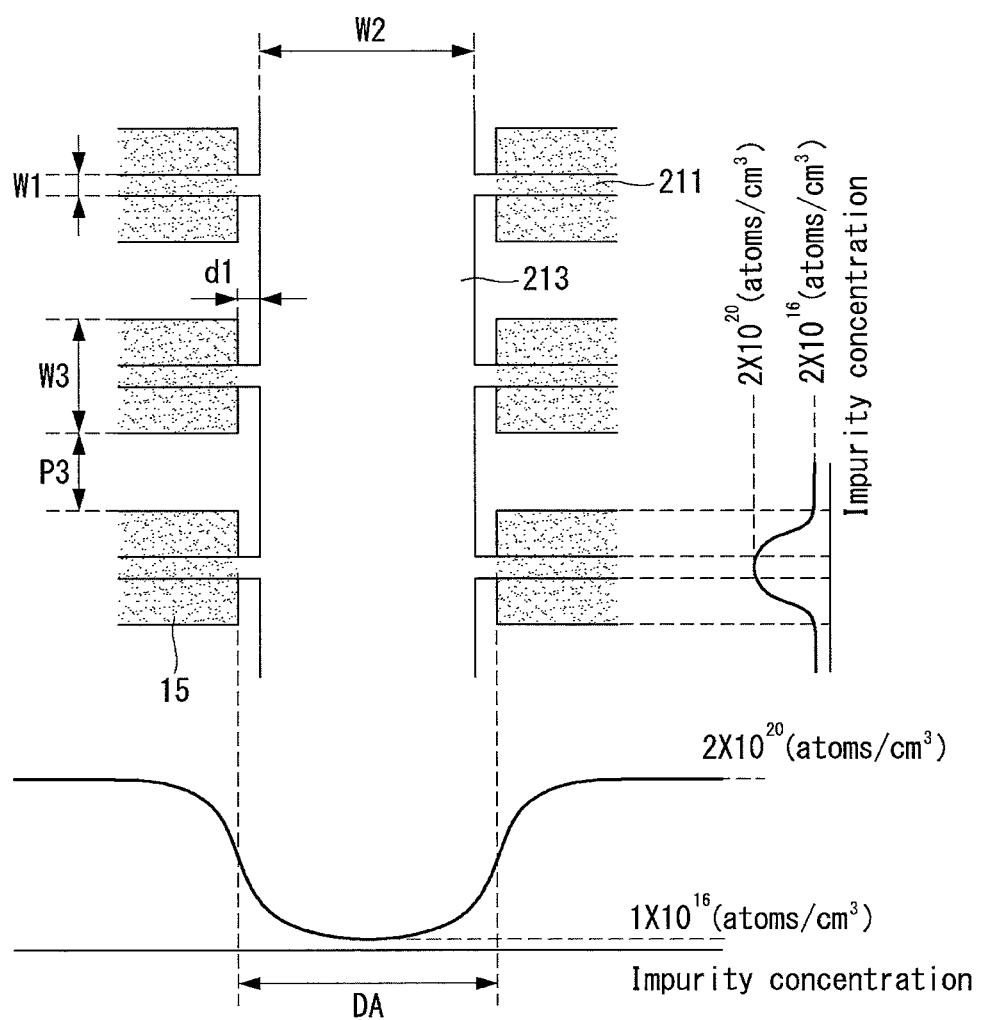
FIG. 4 is a partial enlarged view of a back surface field region shown in FIG. 3.

FIG. 3 selectively shows the back surface field region 15, and FIG. 4 is a partial enlarged view of the back surface field region 15 shown in FIG. 3.

As shown in FIGS. 3 and 4, the collection electrode 21 includes the finger electrodes 211, which have a predetermined width W1 and extend in the horizontal direction, and the bus electrodes 213, which have a width W2 greater than the width W1 of the finger electrodes 211 and extend in the vertical direction crossing the horizontal direction.

In the embodiment of the invention, for example, the width W1 of the finger electrode 211 may be 40 μm to 100 μm, and the width W2 of the bus electrode 213 may be 1.2 mm to 1.7 mm. A pitch P1 between the finger electrodes 211 may be 1.2 mm to 1.8 mm, and a pitch P2 between the bus electrodes 213 may be 52 mm.

The back surface field region 15 is not formed at the entire back surface of the semiconductor substrate 11 and is locally formed only at the finger electrodes 211. Thus, the back surface field regions 15 extend in the horizontal direction in the same manner as the finger electrodes 211 and are separated from one another by a predetermined distance in the vertical direction, thereby entirely forming a stripe arrangement. A pitch P3 between the back surface field regions 15 is less than the pitch P1 between the finger electrodes 211.

A width W3 of the back surface field region 15 may be 200 μm to 500 μm when the width W1 of the finger electrode 211 is 100 μm. In other words, the width W3 of the back surface field region 15 may depend on the width W1 of the finger electrode 211. When the width W3 of the back surface field region 15 is experimentally two to five times the width W1 of the finger electrode 211 in consideration of a working margin, the efficiency of the solar cell, etc., a preferable result may be obtained.

An impurity concentration of the back surface field region 15 may be about $2*10^{20}$ atoms/cm$^3$, and an impurity concentration of the semiconductor substrate 11 may be about $1*10^{16}$ atoms/cm$^3$. As shown in FIG. 4, the impurity concentration of the back surface field region 15 has a Gaussian distribution, in which the left and right sides of the back surface field region 15 are symmetric to each other with respect to the middle of the back surface field region 15. Namely, a middle portion of the back surface field region 15 has a maximum impurity concentration, and the impurity concentration of the back surface field region 15 sharply decreases as it goes to both ends of the back surface field region 15. In other words, the middle portion of the back surface field region 15 is doped with impurities at a high concentration of about $2*10^{20}$ atoms/cm$^3$, and the ends of the back surface field region 15 is doped with impurities at a low concentration of about $1*10^{16}$ atoms/cm$^3$ of the same level as the semiconductor substrate 11.

In the embodiment of the invention, the back surface field region 15 includes a discontinuous region DA having a predetermined width f1 in an extension direction of the finger electrode 211. In the embodiment of the invention, the discontinuous region DA is a region, which is not doped with the impurities at a concentration higher than the semiconductor substrate 11 and substantially has the same impurity concentration as the semiconductor substrate 11. In fact, the discontinuous region DA corresponds to a portion, on which impurities are not doped through an artificial manipulation (or intentionally) when the semiconductor substrate 11 is doped with impurities of the high concentration so as to form the back surface field region 15. Thus, the impurity concentration of the discontinuous region DA is substantially the same as the impurity concentration of the semiconductor substrate 11.

As shown in FIG. 4, the discontinuous region DA is formed at a crossing of the finger electrodes 211 and the bus electrodes 213. As described above, the back surface field region 15 includes the discontinuous region DA in a longitudinal direction of the finger electrode 211. Thus, the impurity concentration of the back surface field region 15 indicates a grade at the crossing.

More specifically, the back surface field region 15 is positioned under the finger electrode 211 in the horizontal direction, extends along the finger electrode 211 in the extension direction of the finger electrode 211, and is separated from the bus electrode 213 by a predetermined distance d1 at the crossing. Thus, the discontinuous region DA having a width corresponding to "W2+2*d1" is formed at the crossing.

In a distribution of the impurity concentration of the discontinuous region DA, an impurity concentration of a start portion of the discontinuous region DA is rapidly reduced and has the same level as the impurity concentration of the semiconductor substrate 11. An entire impurity concentration of the discontinuous region DA is substantially the same as the impurity concentration of the semiconductor substrate 11.

When the semiconductor substrate includes a heavily doped region, a fill factor FF indicating the efficiency of the solar cell may increase through a reduction in a contact resistance. However, in this instance, because a recombination of carriers increases, a short-circuit current Jsc and an open-circuit voltage Voc may decrease. On the other hand, in the embodiment of the invention, the back surface field regions 15 are formed correspondingly to the finger electrodes 211 and are not formed between the finger electrodes 211. As a result, the fill factor FF in the embodiment of the invention is less than the fill factor FF of a solar cell, in which the back surface field region is formed at the entire back surface of the semiconductor substrate. However, the result of an experiment shows that the efficiency of the solar cell according to the embodiment of the invention entirely increases because the short-circuit current Jsc and the open-circuit voltage Voc increase.

In the embodiment of the invention, the discontinuous region DA is formed at the crossing of the finger electrodes 211 and the bus electrodes 213 in the extension direction of the finger electrode 211, and the crossing substantially corresponds to a formation portion of the bus electrode 213. Further, the bus electrode 213 mainly performs not the collection of carriers but the transfer of carriers. Therefore, although the discontinuous region DA is formed at the crossing, an increase in the short-circuit current Jsc and the open-circuit voltage Voc is greater than a reduction in the fill factor FF. As a result, the efficiency of the solar cell may efficiently increase.

Figure 5:
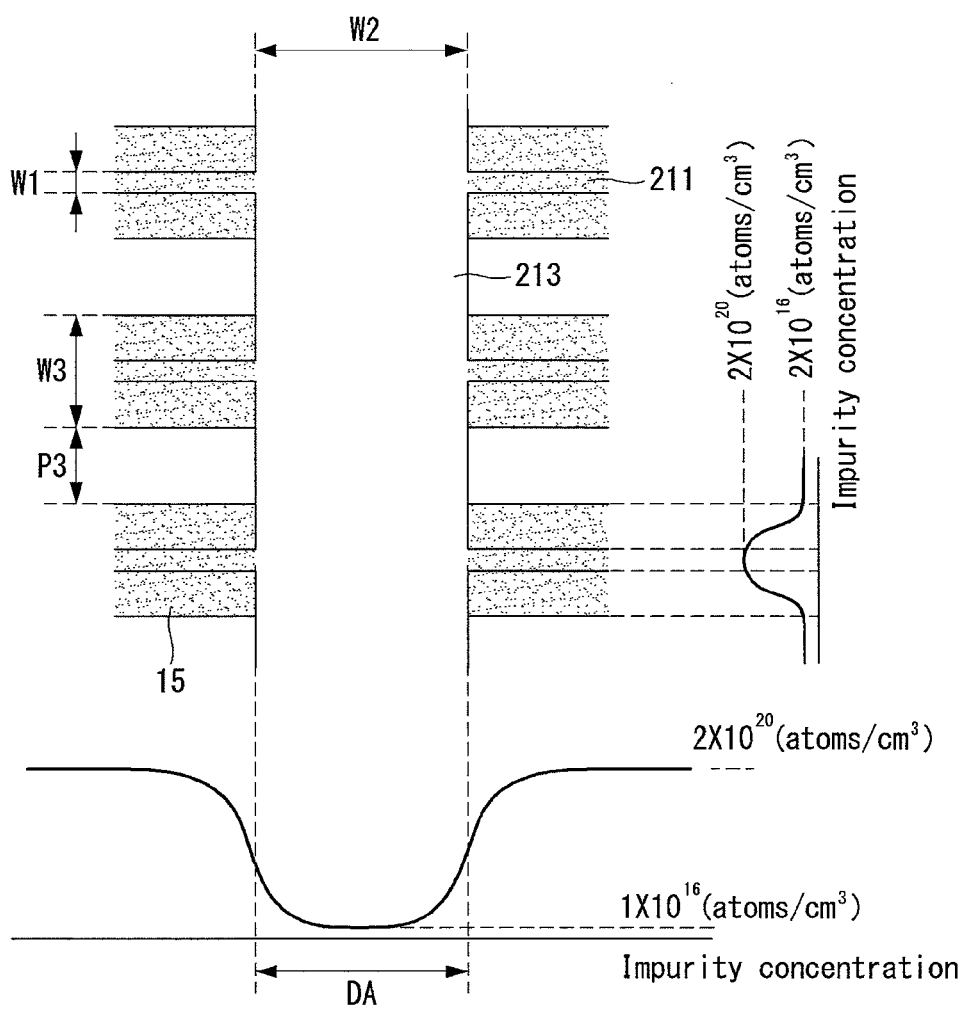
FIGS. 5 and 6 show a position of a discontinuous region.

FIG. 4 shows that the discontinuous region DA is separated from the bus electrode 213 by the predetermined distance d1, as an example. It is preferable, but not required, that the predetermined distance d1 is 40 μm to 80 μm in consideration of a manufacturing process and a working margin, but is not limited thereto. Referring to FIG. 5, the discontinuous region DA has the same width as the width W2 of the bus electrode 213, and an end of the discontinuous region DA and an end of the bus electrode 213 are positioned on the same line.

Figure 6:
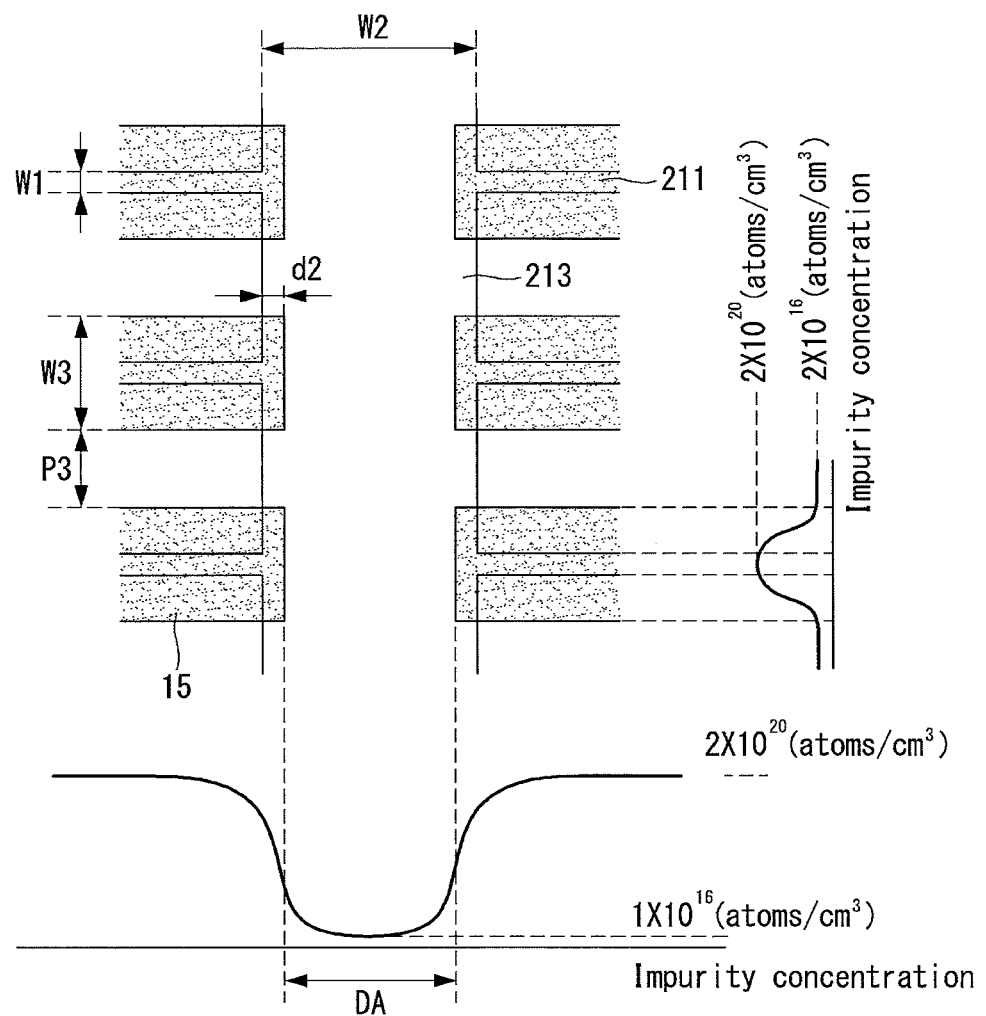

On the contrary to the embodiment of the invention, the width f1 of the discontinuous region DA may be less than the width W2 of the bus electrode 213. As shown in FIG. 6, in this instance, the discontinuous region DA is positioned inside the bus electrode 213 by a predetermined distance d2 from the bus electrode 213. Thus, the discontinuous region DA has a width corresponding to "W2−2*d2". Preferably, the distance d2 may be less than 300 μm in consideration of the working margin and the efficiency.

The widths and the impurity concentrations of the electrodes and the back surface field region proposed in the above-described embodiment of the invention are as follows. Values disclosed in the embodiment of the invention are obtained through an experiment and are organically related variables. Therefore, if any one of the disclosed values is out of range, other values have to be adjusted depending on the changed value. However, according to the result of an experiment conducted by the present inventor, it was impossible to adjust the values by trial and error because of the many variables. Only when the values proposed in the embodiment of the invention were used, the present inventor could proceed to a desired result.

The width W1 of the finger electrode 211 is 40 μm to 100 μm.

The pitch P1 between the finger electrodes 211 is 1.2 mm to 1.8 mm.

The width W2 of the bus electrode 213 is 1.2 mm to 1.7 mm.

The pitch P2 between the bus electrodes 213 is 52 mm.

The width W3 of the back surface field region 15 is 200 μm to 500 μm.

The distance d1 between the back surface field region 15 and the bus electrodes 213 is 40 μm to 8 μm.

Figure 7:
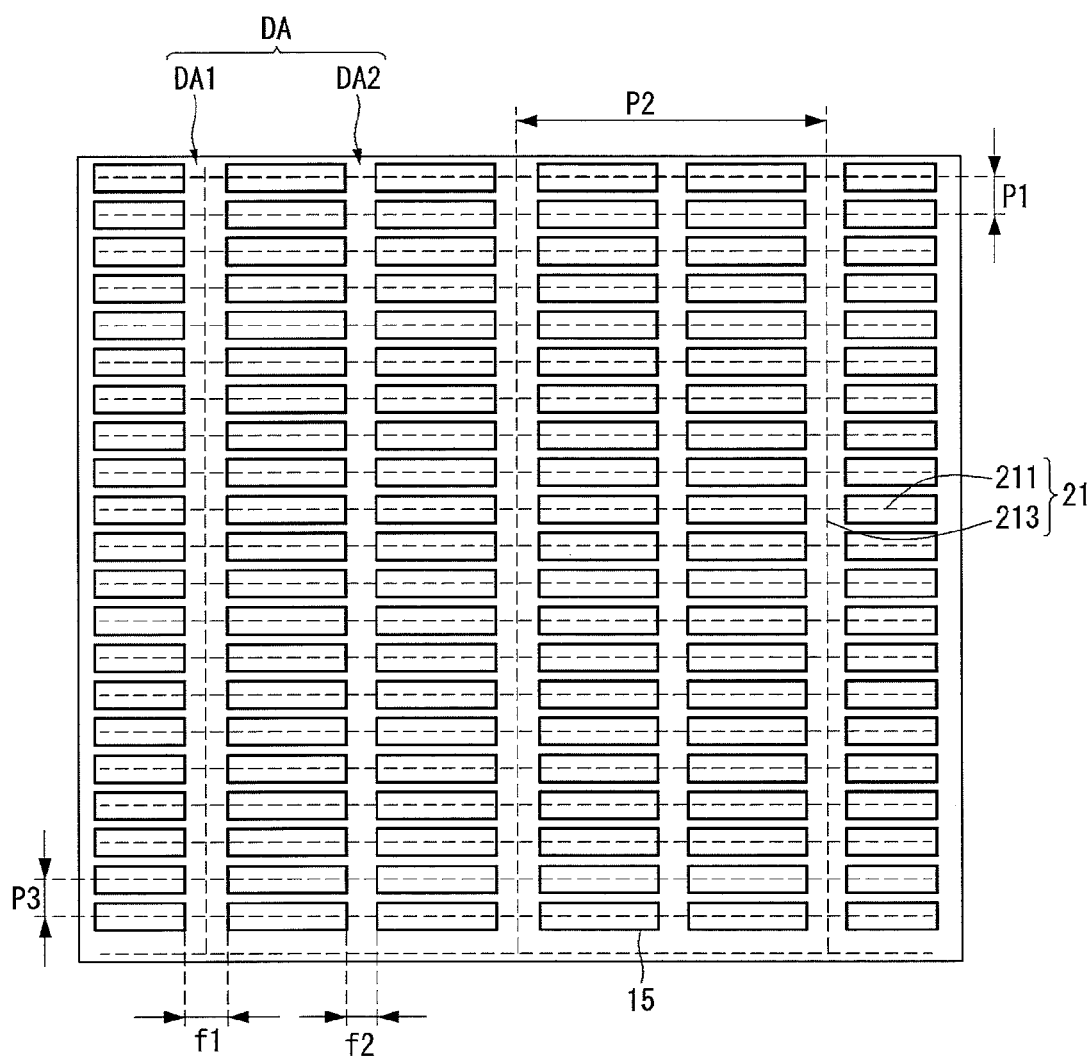
FIG. 7 shows that a discontinuous region is further formed between bus electrodes in addition to a crossing.

FIG. 7 shows that the discontinuous region is further formed between the bus electrodes in addition to the crossing.

As shown in FIG. 7, the discontinuous region DA includes a first discontinuous region DA1 formed at a crossing and a second discontinuous region DA2 formed between the bus electrodes 213. Thus, the first discontinuous region DA1 is formed correspondingly to the bus electrode 213, and the second discontinuous region DA2 is formed correspondingly to the finger electrode 211.

A width f2 of the second discontinuous region DA2 is less than a width f1 of the first discontinuous region DA1. Because the first discontinuous region DA1 corresponds to the bus electrode 213 and the second discontinuous region DA2 corresponds to the finger electrode 211, the second discontinuous region DA2 is formed to be narrower than the first discontinuous region DA1 considering that the second discontinuous region DA2 corresponding to the finger electrode 211 actually collects carriers. An impurity concentration distribution of the second discontinuous region DA2 is substantially the same as the first discontinuous region DA1.

FIG. 7 shows that one second discontinuous region DA2 is formed between the bus electrodes 213, as an example. However, at least two second discontinuous regions DA2 may be formed between the bus electrodes 213. In this instance, widths of at least two second discontinuous regions DA2 may be equal to or different from each other.

Figure 8:
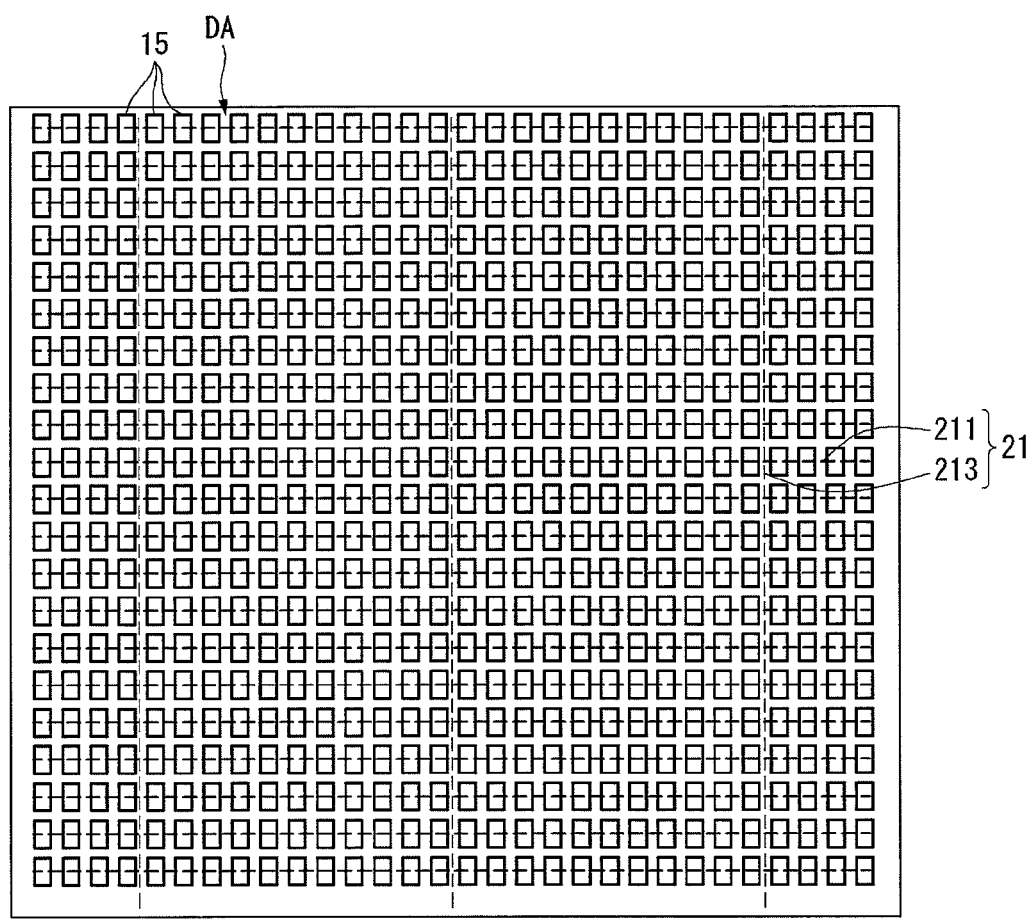
FIG. 8 shows that a back surface field region is formed in an island shape along a finger electrode.

As shown in FIG. 8, the plurality of second discontinuous regions are formed, and the back surface field regions 15 are formed in an island shape along the finger electrodes 211.

Figure 9:
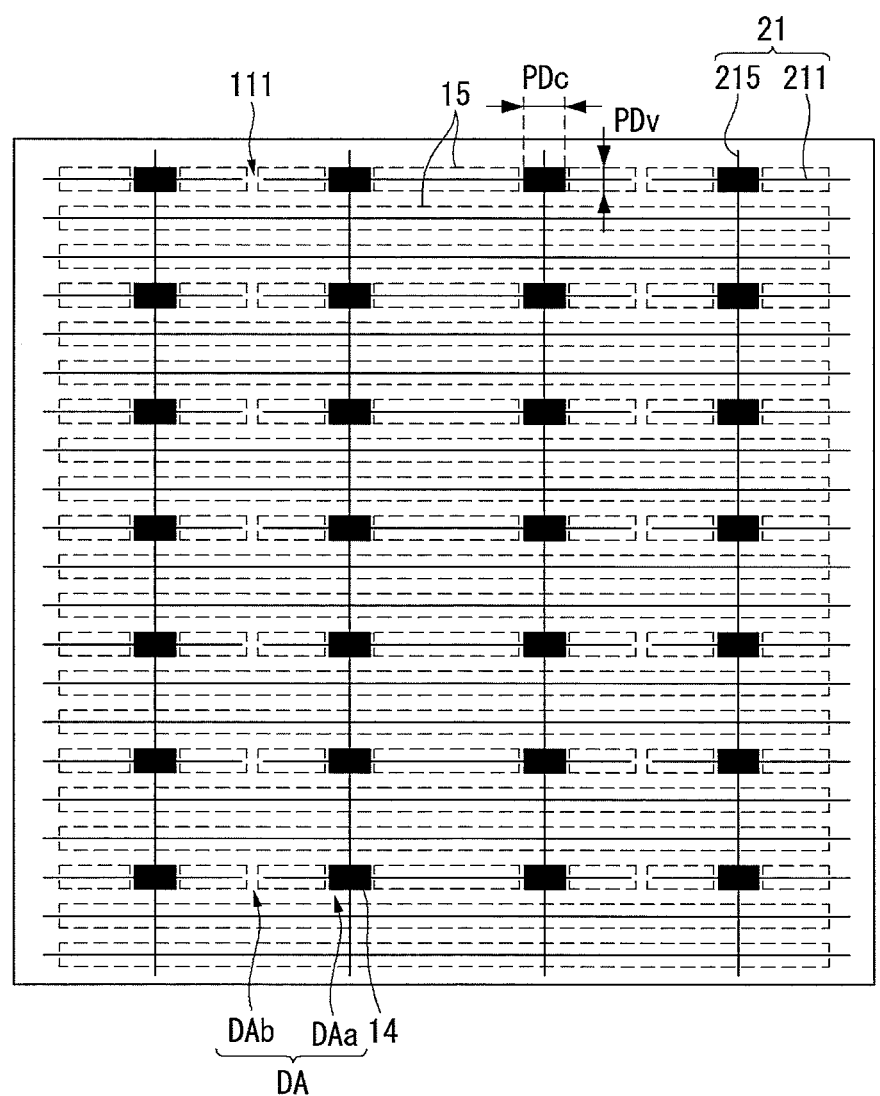
FIG. 9 shows a configuration of a back surface of a solar cell according to another example embodiment of the invention.
Figure 10:
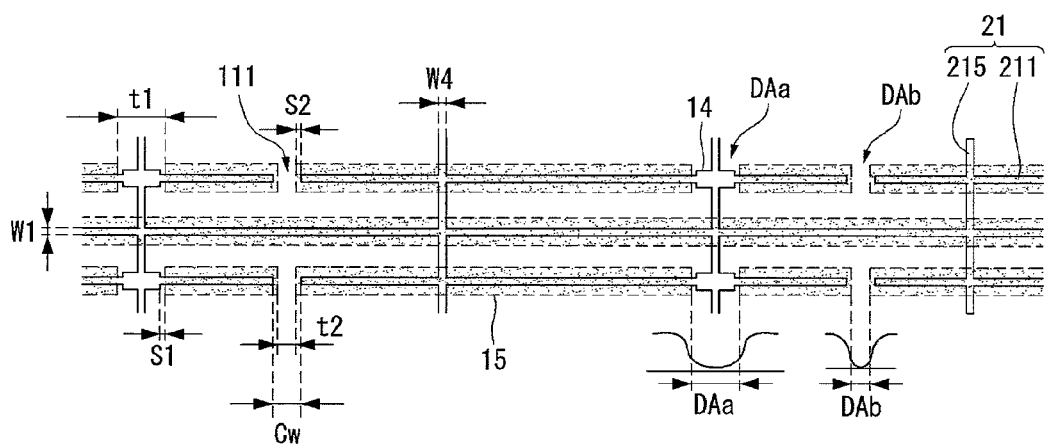
FIG. 10 is a partial enlarged view of a solar cell shown in FIG. 9.

FIG. 9 shows a configuration of a back surface of a solar cell according to another example embodiment of the invention, and FIG. 10 is a partial enlarged view of the solar cell shown in FIG. 9. In the embodiment of the invention, the solar cell includes a collection electrode 21 formed on a back surface of a semiconductor substrate and a back surface field region 15, which is more heavily doped than the semiconductor substrate with impurities of the same conductive type as the semiconductor substrate. An impurity concentration of the back surface field region 15 has a Gaussian distribution, in which a middle portion of the back surface field region 15 is doped with impurities at a concentration of about $2*10^{20}$ atoms/cm$^3$, and an end of the back surface field region 15 is doped with impurities at a concentration of about $1*10^{16}$ atoms/cm$^3$, in the same manner as the above-described embodiment of the invention.

The collection electrode 21 includes finger electrodes 211 and connection electrodes 215.

The finger electrodes 211 have a predetermined width W1 and extend in a horizontal direction. The connection electrodes 215 have a predetermined width W4 and extend in a vertical direction. The connection electrodes 215 cross the finger electrodes 211 and electrically connect the finger electrodes 211. In the embodiment of the invention, the width W4 of the connection electrode 215 may be equal to the width W1 of the finger electrode 211. Alternatively, the width W4 of the connection electrode 215 may be greater than the width W1 of the finger electrode 211 and may be less than the width W2 of the bus electrode 213. The connection electrodes 215 electrically connect the finger electrodes 211 each having a disconnection portion 111.

Pads 14 are selectively formed at crossings of the finger electrodes 211 and the connection electrodes 215 and increase an area of a meeting portion of the electrode and a wiring member at the crossing. Hence, when an interconnector connecting the solar cells is connected to the electrodes of the solar cells, the pads 14 make it easier to connect the interconnector to the electrodes. Further, the pads 14 reduce a contact resistance and increase the efficiency of the solar cell.

The pad 14 may be formed of the same material as the electrode. In this instance, the pad 14 may be configured as the same layer as the electrode. Alternatively, the pad 14 may be formed of a material different from the electrode. In this instance, the pad 14 may be configured as a layer different from the electrode.

A horizontal width PDc of the pad 14 may be greater than the width W4 of the connection electrode 215, and a vertical width PDv of the pad 14 may be greater than the width W1 of the finger electrode 211.

It is preferable, but not required, that the pads 14 are respectively formed at all of the crossings of the finger electrodes 211 and the connection electrodes 215. However, the pads 14 may be selectively formed on odd-numbered lines or even-numbered lines, or may be randomly formed. Further, it is preferable, but not required, that the pads 14 are formed on different lines according to a predetermined rule, compared to the formation of the pads 14 at all of the crossings in the vertical direction. However, the pads 14 may be selectively formed at all of the crossings or may be randomly formed.

The finger electrode 211 may include the disconnection portion 111. The disconnection portion 111 is a portion, in which the finger electrode 211 does not exist by a predetermined width Cw in a longitudinal direction of the finger electrode 211. When a pitch between the connection electrodes 215 is 10 mm to 13 mm, the width Cw of the disconnection portion 111 may be 1.5 mm to 1.8 mm. Further, the width Cw of the disconnection portion 111 may vary depending on the pitch or the width of the connection electrode 215, the pitch or the width of the finger electrode 211, and the like.

FIG. 9 shows that the disconnection portion 111 is formed every two lines, as an example. However, the position of the disconnection portion 111 may be variously changed. For example, the disconnection portion 111 may be formed on each line or every three lines, or may be randomly formed. In the embodiment of the invention, the disconnection portion 111 is formed between the connection electrodes 215. However, the disconnection portion 111 may be formed at various positions.

The back surface field regions 15 are locally formed at the finger electrodes 211 in the same manner as the above-described embodiment and thus entirely form a stripe arrangement. The back surface field region 15 includes a discontinuous region DA, and a width of the back surface field region 15 may be two to five times the width W1 of the finger electrode 211.

The discontinuous region DA is a region, which is not doped with impurities and substantially has the same impurity concentration as the semiconductor substrate, in the same manner as the above-described embodiment.

In the embodiment of the invention, the discontinuous region DA is formed correspondingly to the pad 14 and the disconnection portion 111. A width t1 of a first discontinuous region DAa corresponding to the pad 14 is greater than the horizontal width PDc of the pad 14, and a width t2 of a second discontinuous region DAb corresponding to the disconnection portion 111 is less than the width Cw of the disconnection portion 111.

The discontinuous region DA is separated from the pad 14 by a predetermined distance S1. Thus, the first discontinuous region DAa having the width t1 corresponding to "PDc+2*S1" is formed. Preferably, the distance S1 may be 40 μm to 80 μm.

The discontinuous region DA extends from an end of the electrode forming the disconnection portion 111 by a predetermined distance S2. Thus, the second discontinuous region DAb having the width t2 corresponding to "Cw−2*S2" is formed. Preferably, the distance S2 may be 40 μm to 80 μm.

Impurity concentrations of the first discontinuous region DAa and the second discontinuous region DAb have the same distribution as the above-described discontinuous region DA. Namely, they have Gaussian distribution, in which a middle portion of the back surface field region 15 has a maximum impurity concentration, and the impurity concentration of the back surface field region 15 sharply decreases as it goes to both ends of the back surface field region 15. In other words, the middle portion of the back surface field region 15 is doped with impurities at a high concentration of about $2*10^{20}$ atoms/cm$^3$, and the end of the back surface field region 15 is doped with impurities at a low concentration of about $1*10^{16}$ atoms/cm$^3$ of the same level as the semiconductor substrate.

Figure 11:
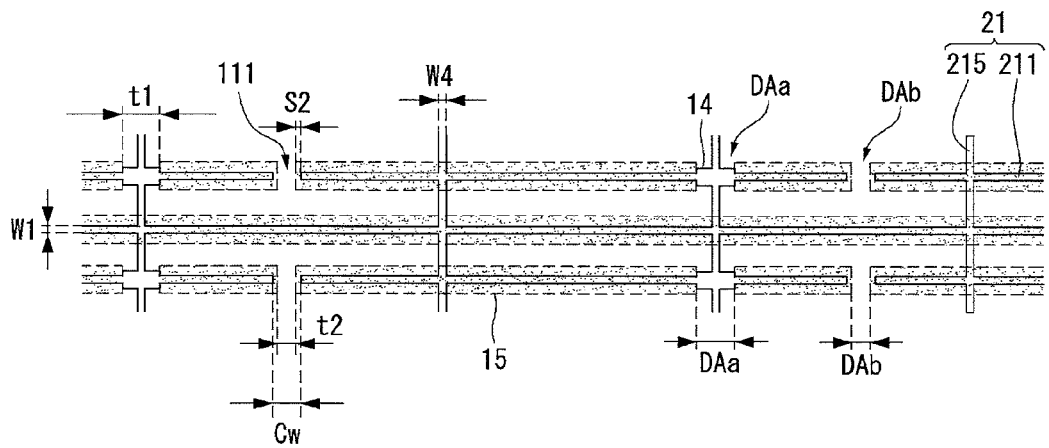
FIGS. 11 and 12 show a position of a discontinuous region.

The embodiment of the invention described that the discontinuous region DA is separated from the pad 14 by the distance S1 and is separated from the disconnection portion 111 by the distance S2. Other configuration may be used. For example, as shown in FIG. 11, the discontinuous region DA may have the same width as the pad 14 or the disconnection portion 111. An end of the first discontinuous region DAa and an end of the pad 14 may be positioned on the same line, and also an end of the second discontinuous region DAb and an end of the disconnection portion 111 may be positioned on the same line.

Figure 12:
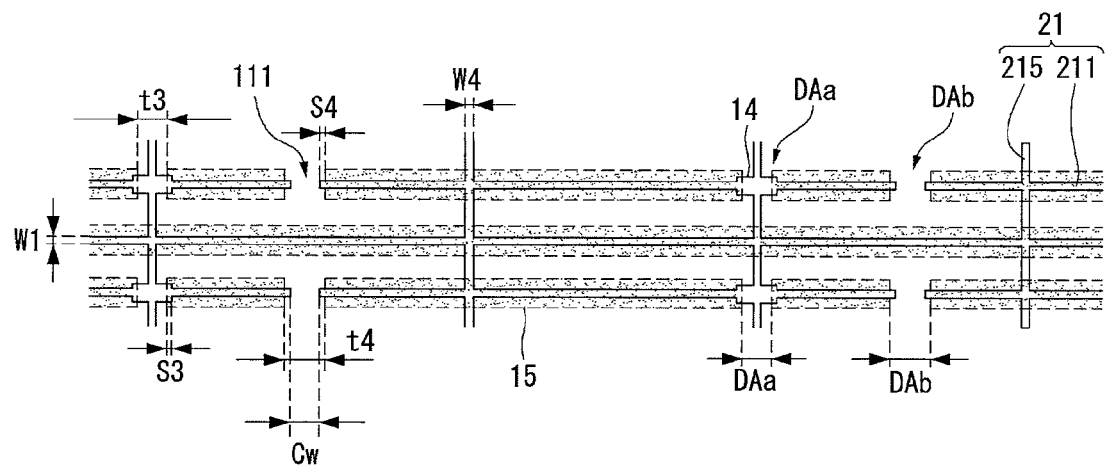

On the contrary to the embodiment of the invention, as shown in FIG. 12, a width t3 of the first discontinuous region DAa may be less than the horizontal width PDc of the pad 14, and a width t4 of the second discontinuous region DAb may be greater than the width Cw of the disconnection portion 111.

As shown in FIG. 12, in this instance, the first discontinuous region DAa is positioned inside the pad 14 by a predetermined distance S3 from the pad 14. Thus, the first discontinuous region DAa has the width t3 corresponding to "PDc−2*S3". Preferably, the distance S3 may be less than 300 μm in consideration of the working margin and the efficiency.

Further, the second discontinuous region DAb is not formed by a predetermined distance S4 from an end of the electrode forming the disconnection portion 111. Thus, the second discontinuous region DAb has the width t4 corresponding to "Cw+2*S4". Preferably, the distance S4 may be less than 300 μm in consideration of the working margin and the efficiency.

The embodiment of the invention described that the pad 14 has a rectangular shape. Other shapes may be used for the pad 14. For example, as shown in FIG. 13, the pad 14 may have a polygon shape or a curved shape.

When the collection electrode 21 further includes the pad 14 as described above, the connection between the interconnector and the electrodes is improved. Hence, the finger electrodes may be connected to one another by forming the disconnection portion 111 or forming the connection electrode having a width less than a related art bus electrode. As a result, the manufacturing cost may be reduced.

The interconnector is connected to the pad 14 through a solder. However, the solder connects the pad 14 to the interconnector while being applied to the pad 14 in a state the solder is melted by heat and hardening. The solder of the molten state is applied in a circular shape because of a surface tension. Therefore, it is preferable, but not required, that the pad 14 is formed in a curved shape in accordance with the circular shape of the applied solder, as shown in (A) and (B) of FIG. 13. In FIG. 13, (A) shows a circular pad 14, (B) shows an oval pad 14.

Figure 13:
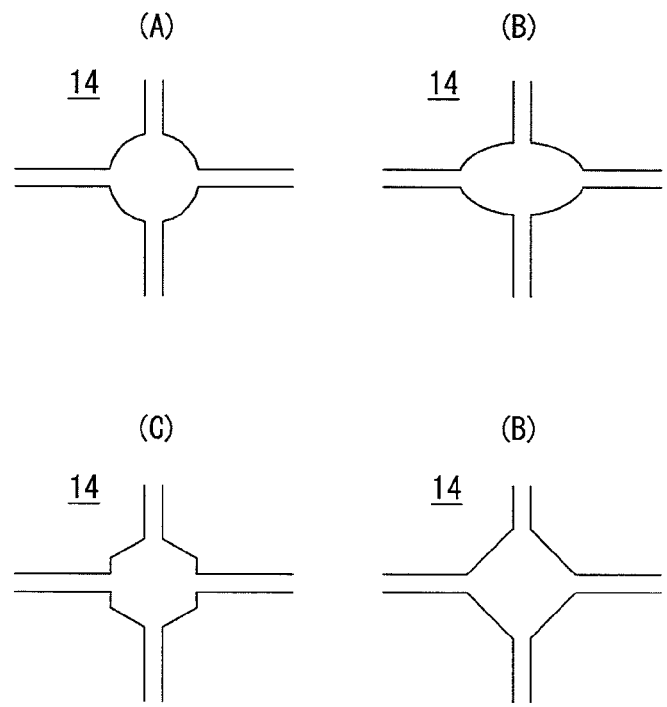
FIG. 13 shows various shapes of a pad.

As shown in (C) and (D) of FIG. 13, the pad 14 may be formed in a polygon shape. In this instance, it may be easier to form the pad. In FIG. 13, (C) shows a hexagon pad 14, and (D) shows a diamond-shaped pad 14.

Figure 14:
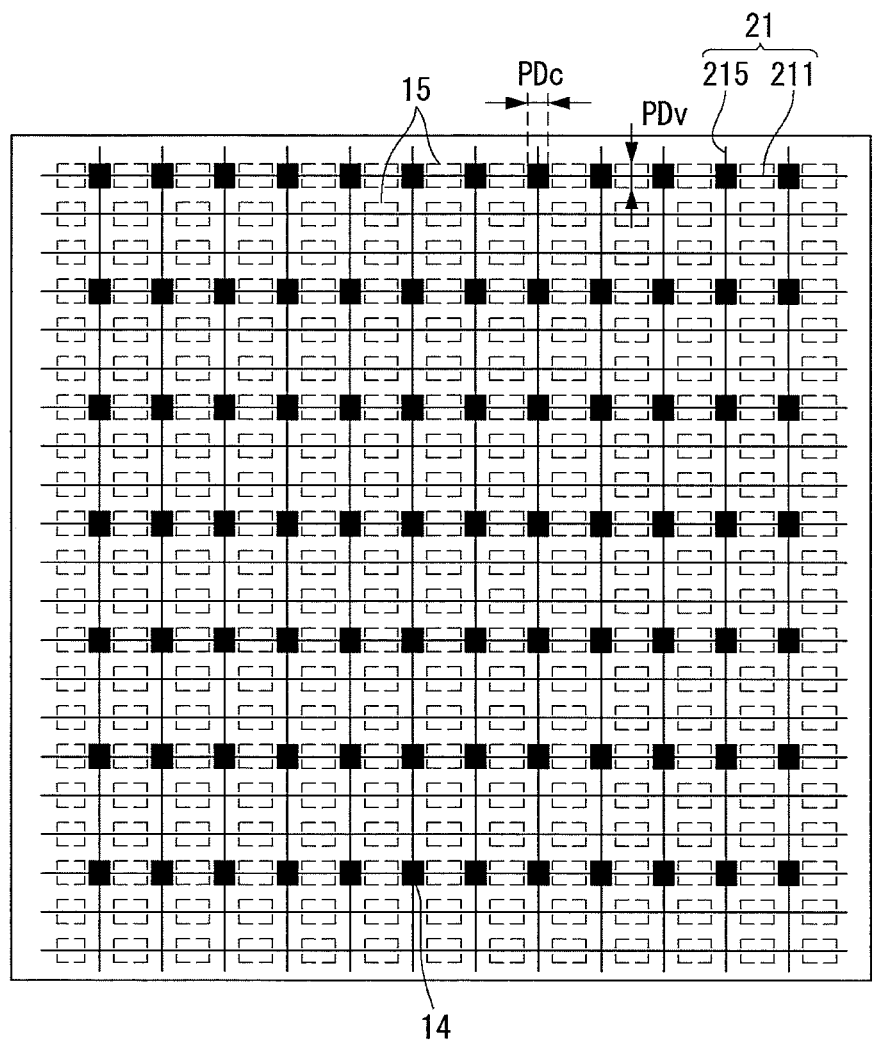
FIG. 14 shows an example where a collection electrode includes 12 connection electrodes.

FIG. 14 shows an example where the collection electrode 21 includes the 12 connection electrodes 215 arranged in parallel with one another. On the other hand, FIG. 9 shows an example where the collection electrode 21 includes the 4 connection electrodes 215 arranged in parallel with one another. The finger electrode 211 shown in FIG. 14 does not include the disconnection portion 111, and thus the discontinuous region corresponding to the disconnection portion 111 is not formed. Instead, in FIG. 14, the discontinuous region is formed along the pad and a crossing of the connection electrode and the finger electrode.

Hereinafter, a solar cell module including the solar cells, in which the back surface field region has the discontinuous region, is described. In the following description, the embodiment of the invention is described using the solar cell module including the solar cells shown in FIG. 14 as an example.

Figure 15:
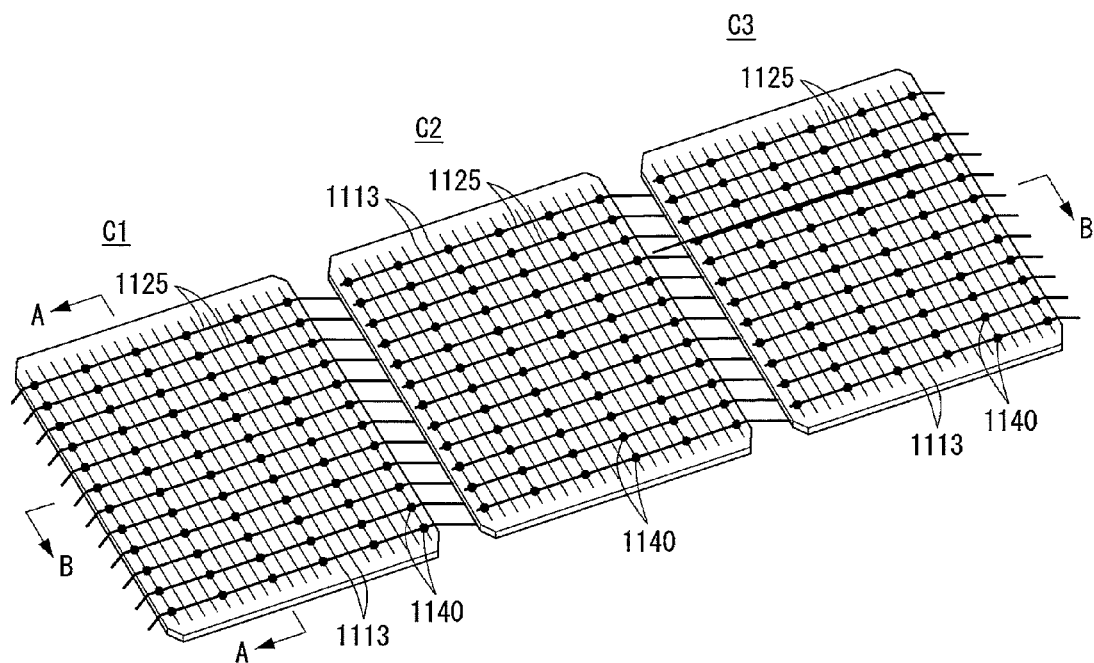
FIG. 15 is a prospective view of a solar cell module, in which three solar cells are connected to one another through wiring members.
Figure 16:
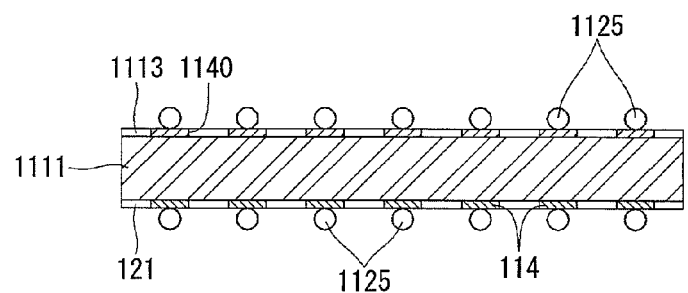
FIG. 16 is a cross-sectional view taken along line A-A of FIG. 15.
Figure 17:
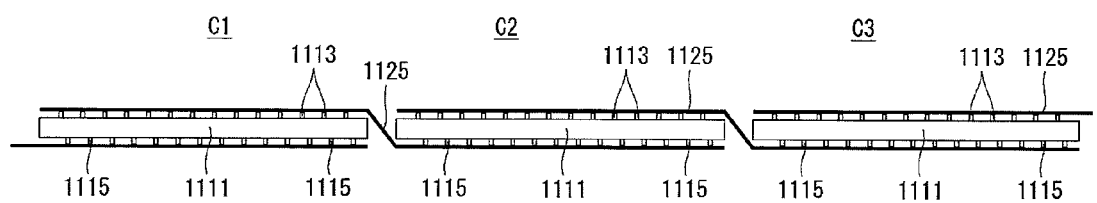
FIG. 17 is a cross-sectional view taken along line B-B' of FIG. 15.
Figure 18:
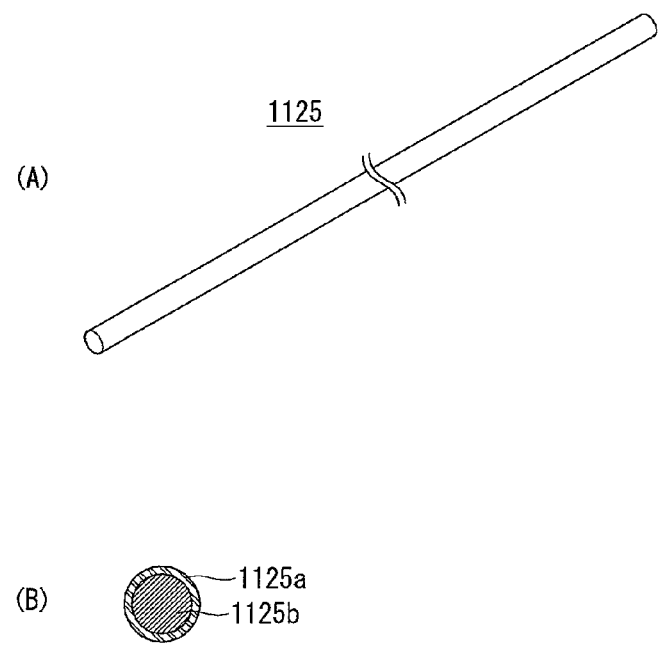
FIG. 18 shows a wiring member.

FIG. 15 is a prospective view of a solar cell module, in which three solar cells are connected to one another through wiring members. FIG. 16 is a cross-sectional view taken along line A-A of FIG. 15. FIG. 17 is a cross-sectional view taken along line B-B of FIG. 15. FIG. 18 shows a wiring member.

As shown in FIGS. 15 to 18, the solar cell module according to the embodiment of the invention connects a plurality of solar cells, which are positioned adjacent to one another, using a plurality of wiring members 1125. The wiring member 1125 is electrically connected to front electrodes 1113 formed on a front surface of a first solar cell C1 of two adjacent solar cells and is electrically connected to back electrodes 1115 formed on a back surface of a second solar cell C2 adjacent to the first solar cell C1, thereby electrically connecting the two adjacent solar cells.

In the embodiment of the invention, the solar cell has a conventional structure, in which electrodes are positioned on each of a front surface and a back surface of a semiconductor substrate 1111.

The solar cell has a cube shape having a thin (or a certain) thickness. The solar cell of the cube shape has the size of approximately 156 mm long and 156 mm wide and a thickness of 150 μm to 200 μm.

The front electrodes 1113 are formed on the front surface of the semiconductor substrate 1111, on which light is incident, and are connected to the wiring member 1125. The front electrodes 1113 collect carriers of a conductive type opposite a conductive type of the semiconductor substrate 1111. For example, if the semiconductor substrate 1111 is a p-type semiconductor substrate, the front electrodes 1113 may collect electrons.

As an example, the front electrodes 1113 extend in a direction crossing a longitudinal direction of the wiring member 1125 and are arranged in parallel with one another, thereby entirely forming a stripe arrangement.

The semiconductor substrate 1111 forms a p-n junction and is an n-type or p-type semiconductor substrate containing impurities of a first conductive type.

The back electrode 1115 is formed on the back surface of the semiconductor substrate 1111 in a direction crossing the front electrodes 1113. The back electrode 1115 collects carriers of a conductive type opposite a conductive type of the front electrodes 1113.

The back electrode 1115 has configuration corresponding to the collection electrode 21 of FIG. 14 and includes finger electrodes 1211 and connection electrodes 1215 in the same manner as the collection electrode 21 of FIG. 14. A pad 1114 is formed at a crossing of the finger electrode 1211 and the connection electrode 1215. A back surface field region 1115 is formed with respect to each finger electrode 1211 and includes a discontinuous region DA. This is described later with reference to the drawings.

An emitter region reducing a potential barrier and a passivation layer preventing a recombination of carriers at the surface of the semiconductor substrate 1111 exist between the semiconductor substrate 1111 and the front electrodes 1113 and between the semiconductor substrate 1111 and the back electrodes 1115.

The two adjacent solar cells each having the above-described configuration are connected to each other using the plurality of wiring members 1125.

As shown in (A) of FIG. 18, the wiring member 1125 may have a wire shape having a circular cross section. (B) of FIG. 18 shows the circular cross section of the wiring member 1125.

As shown in FIG. 18, the wiring member 1125 has a structure, in which a coating layer 1125a is coated on a core layer 1125b with a thin thickness (for example, about 12 μm or less). The entire thickness of the wiring member 1125 is 300 μm to 500 μm.

The core layer 1125b is formed of a metal material with the good conductivity, for example, Ni, Cu, Ag, and Al. The coating layer 1125a is formed of Pb, Sn, or a metal material having a chemical formula indicated by SnIn, SnBi, SnPb, SnCuAg, and SnCu and includes a solder. Hence, the coating layer 1125a may use the soldering.

When the two adjacent solar cells are connected to each other using the wiring member 1125, 10 to 18 wiring members 1125 may be used when the size of the semiconductor substrate is 156 mm long and 156 mm wide. The number of wiring members 1125 may vary depending on the size of the semiconductor substrate, a width, a thickness, a pitch of the electrodes, etc.

So far, the embodiment of the invention described the wiring member 1125 having the wire shape of the circular cross section. However, the cross section of the wiring member 1125 may have various shapes including a rectangle and an oval.

The wiring member 1125 electrically connects the two adjacent first and second solar cells C1 and C2 by connecting one side of the wiring member 1125 to the front electrode 1113 of the first solar cell C1 and connecting the other side of the wiring member 1125 to the back electrode 1115 of the second solar cell C2. A preferable method for connecting the electrodes to the wiring member is the soldering method for melting and combining the material.

In the embodiment of the invention, pads 1140 are selectively positioned at crossings of the front electrodes 1113 and the wiring members 1125. The pad 1140 increases an area of the crossing of the front electrode 1113 and the wiring member 1125 and reduces a contact resistance when the front electrode 1113 is connected to the wiring member 1125. Further, the pad 1140 increases a connection strength between the front electrode 1113 and the wiring member 1125. In the same manner as the front electrode 1113, pads 1140 are selectively positioned at crossings of the back electrodes 1115 and the wiring members 1125 and make it easier to connect the back electrodes 1115 to the wiring members 1125. The pad 1140 is substantially the same as the pad according to the above-described embodiment.

As an example of the soldering method, the wiring members 1125 are positioned on both the front surface and the back surface of each of the two adjacent solar cells and are positioned opposite the front electrodes 1113 and the back electrodes 1115 of each of the two adjacent solar cells. In such a state, the coating layers 1125a of the wiring members 1125 are heated for several seconds at a temperature equal to or higher than a melting temperature. As a result, while the coating layers 1125a are melted and cooled, the wiring members 1125 are attached to the front electrodes 1113 and the back electrodes 1115.

Figure 19:
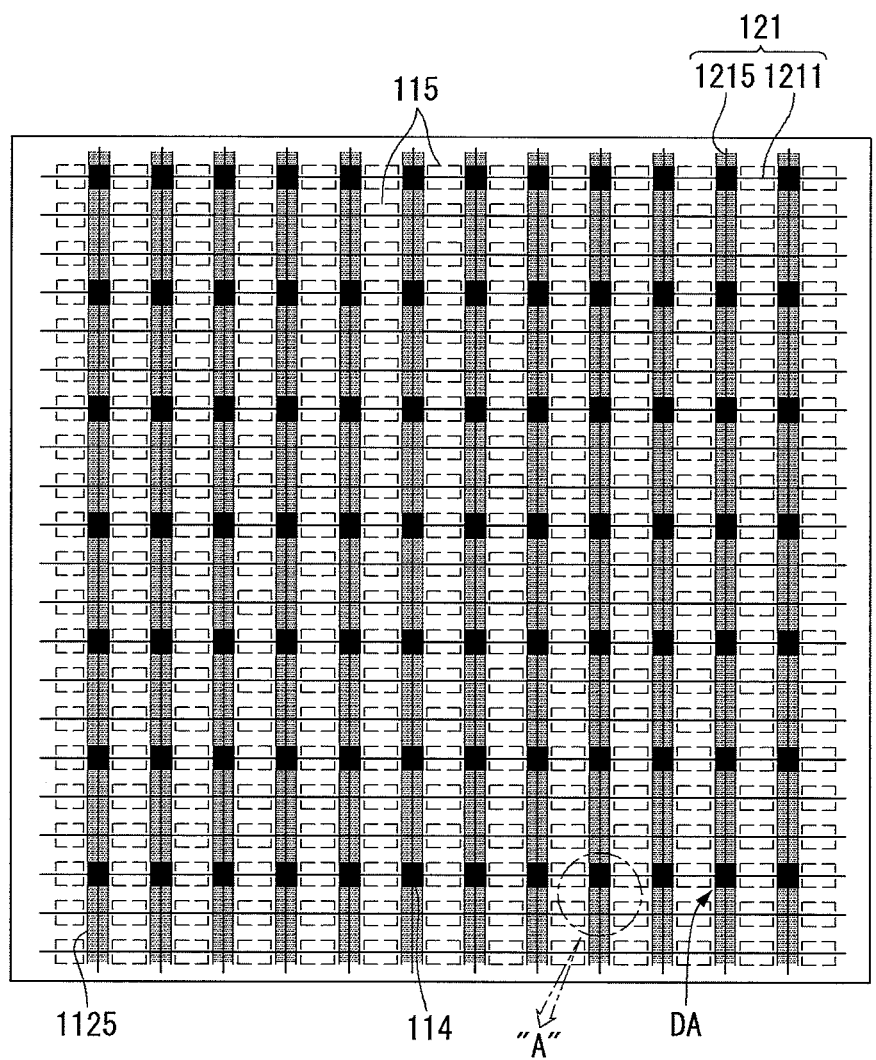
FIG. 19 schematically shows a disposition structure of a back electrode and a wiring member at a back surface of a solar cell.
Figure 20:
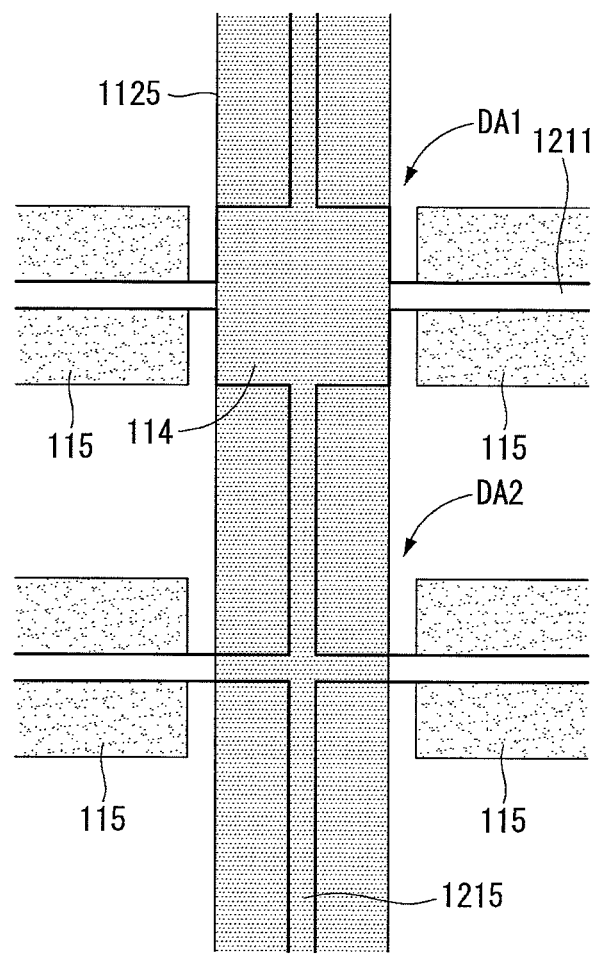
FIG. 20 is an enlarged view of a portion "A" of FIG. 19.

FIG. 19 schematically shows a disposition structure of a back electrode and a wiring member at a back surface of a solar cell, and FIG. 20 is an enlarged view of a portion "A" of FIG. 19.

The configuration of the back surface of the solar cell shown in FIGS. 19 and 20 is substantially the same as FIG. 14.

Accordingly, a back electrode 121 includes finger electrodes 1211 and connection electrodes 1215. Pads 114 are selectively formed at crossings of the finger electrodes 1211 and the connection electrodes 1215. The Pads 114 are electrically connected to one another through the connection electrodes 1215 in a direction crossing the finger electrode 1211.

Back surface field regions 115 are locally formed with respect to the finger electrode 1211 in the same manner as the above-described embodiment, and thus entirely form a stripe arrangement. The back surface field region 115 includes a discontinuous region DA.

In the embodiment of the invention, the discontinuous region DA is a region, which is not doped with impurities and substantially has the same impurity concentration as a semiconductor substrate, in the same manner as the above-described embodiment.

In the embodiment of the invention, the discontinuous region DA includes a first discontinuous region DA1 formed correspondingly to the pad 114 and a second discontinuous region DA2, which is not formed at the pad 114 and is formed at a crossing of a wiring member 1125 and the finger electrode 1211. It is preferable, but not required, that a width of the second discontinuous region DA2 is substantially equal to a width of the first discontinuous region DA1. Hence, the first discontinuous region DA1 and the second discontinuous region DA2 may be formed through one process.

The wiring members 1125 are respectively positioned on the connection electrodes 1215 in parallel with one another and are electrically connected to the pads 114. Thus, the number of wiring members 1125 is substantially the same as the number of connection electrodes 1215.

The wiring members 1125 are electrically connected to the pads 114 through a physical connection method such as the soldering in a state where the wiring members 1125 are positioned as described above.

Because the wiring members 1125 are positioned and are electrically connected as described above, it is preferable, but not required, that the widths of the first discontinuous region DA1 and the second discontinuous region DA2 are greater than a width of the wiring member 1125.

In the embodiment of the invention, the first discontinuous region DA1 and the second discontinuous region DA2 are respectively formed at the pad 114 and the crossing based on one wiring member 1125. Therefore, the total number of first and second discontinuous regions DA1 and DA2 formed with respect to one wiring member 1125 is substantially the same as the total number of finger electrodes 1211.

Figure 21:
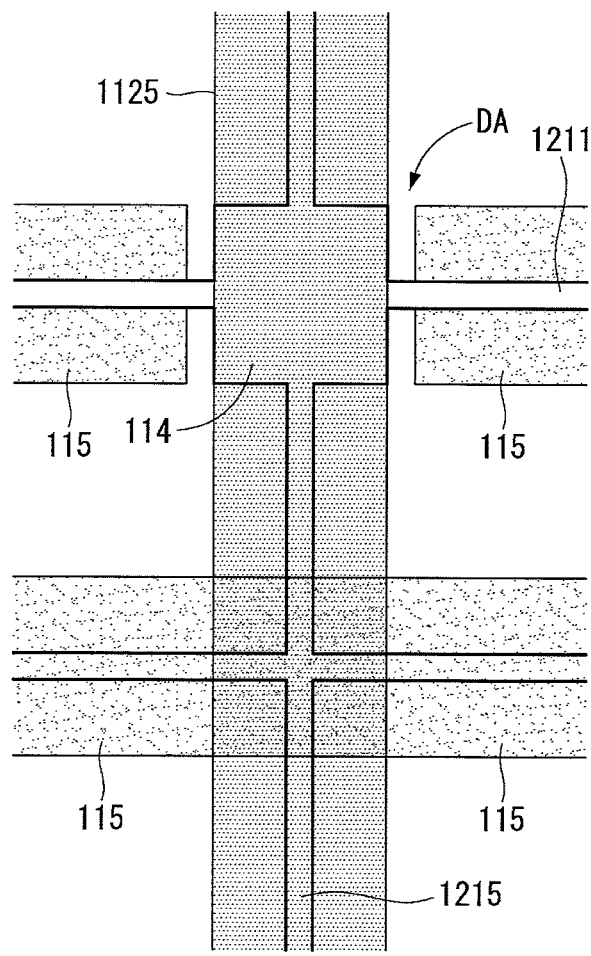
FIG. 21 shows an example where a second discontinuous region is not formed at a crossing, compared to FIG. 20.

On the other hand, as shown in FIG. 21, the discontinuous region DA is formed at the pad 114 and is not formed at the crossing. Therefore, the total number of discontinuous regions DA formed with respect to one wiring member 1125 is less than the total number of finger electrodes 1211.

Accordingly, the number of discontinuous regions DA formed with respect to one wiring member 1125 is equal to or more than the number of pads 114 and is equal to or less than the number of finger electrodes 1211.

Configuration of FIG. 21 is different from configuration of FIG. 20, in that the second discontinuous region is not formed at the crossing.

As shown in FIG. 20, because the first discontinuous region DA1 and the second discontinuous region DA2 are respectively formed at the pad 114 and the crossing, the total number of first and second discontinuous regions DA1 and DA2 is substantially the same as the total number of crossings formed by the finger electrodes 1211 and the wiring members 1125.

On the other hand, as shown in FIG. 21, because the discontinuous region DA is formed at the pad 114 and is not formed at the crossing, the total number of discontinuous regions DA is less than the total number of crossings formed by the finger electrodes 1211 and the wiring members 1125.

Figure 22:
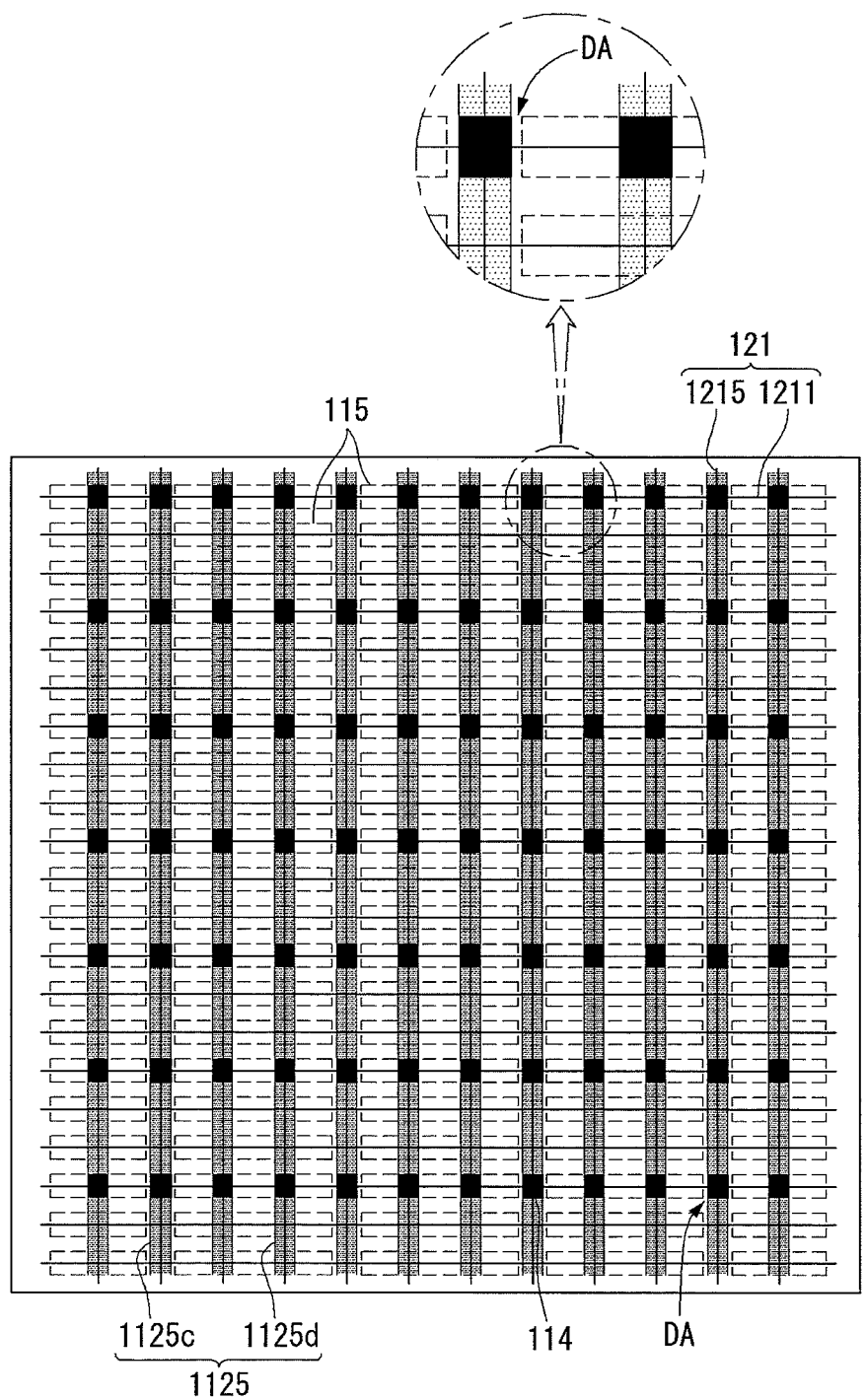
FIG. 22 shows an example where a discontinuous region is selectively formed.

Configuration of FIG. 22 is substantially the same as configuration of FIG. 19 except a formation position of the discontinuous region.

More specifically, the discontinuous region DA is formed correspondingly to each wiring member in FIG. 19, but the discontinuous region DA is selectively formed in FIG. 22. Hence, the wiring member 1125 is divided into a first wiring member 1125c formed correspondingly to the discontinuous region DA and a second wiring member 1125d, which is not formed correspondingly to the discontinuous region DA, depending on whether or not the wiring member 1125 corresponds to the discontinuous region DA.

As shown in FIG. 22, the total number of first wiring members 1125c may be four, and the total number of second wiring members 1125d may be eight. The first wiring members 1125c may be arranged at a position corresponding to a multiple of three, so that the first wiring members 1125c are evenly distributed on the entire solar cell.

According to an experiment conducted by the present inventor, when the four or more first wiring members 1125c were used, the solar cell module had a desired output and desired durability. Further, when the 10 to 18 wiring members were used to connect the adjacent solar cells, the solar cell module obtained the desired output.

Accordingly, a ratio of the minimum number of first wiring members 1125c based on the total number of wiring members 1125 is 0.2 to 0.4. When the number of first wiring members 1125c is within the above range, the solar cell module has a desired performance.

Although embodiments have been described with reference to a number of illustrative embodiments thereof, it should be understood that numerous other modifications and embodiments can be devised by those skilled in the art that will fall within the scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A solar cell comprising:
 a substrate of a first conductive type;
 a plurality of first electrodes positioned on one surface of the substrate in parallel with one another, the plurality of first electrodes being extended in a first direction with a first width, and a distance between two adjacent first electrodes of the plurality of first electrodes having a first distance;
 a plurality of second electrodes extended in a second direction crossing the first direction and connected to the first electrodes, and each of the plurality of second electrodes having a second width; and
 a plurality of first surface field regions doped with impurities of the first conductive type at a concentration higher than the substrate, the first surface field regions extending in the first direction with a third width wider than the first width, and a distance between two adjacent first surface field regions of the plurality of first surface field regions having a second distance less than the first distance, wherein the first surface field regions include discontinuous regions having an impurity concentration lower than an impurity concentration of the first surface field regions,
the discontinuous regions being positioned at crossings of the first electrodes and the second electrodes and extending in the first direction, and
an extended width of the discontinuous regions is greater than the second width of the second electrodes.

2. The solar cell of claim 1, wherein the impurity concentration of the discontinuous regions is the same as an impurity concentration of the substrate.

3. The solar cell of claim 2, wherein the impurity concentration of the discontinuous regions has a Gaussian distribution, in which left and right sides of the discontinuous regions are symmetric to each other.

4. The solar cell of claim 1, wherein the third width of the first surface field region is two to five times the first width of the first electrodes and is less than the first distance of the first electrodes.

5. The solar cell of claim 1, wherein the discontinuous regions include first discontinuous regions positioned at the crossings and second discontinuous regions positioned between adjacent crossings.

6. The solar cell of claim 5, wherein a width of the first discontinuous regions is greater than a width of the second discontinuous regions.

7. The solar cell of claim 1, further comprising:
pads selectively positioned at the crossings of the first electrodes and the second electrodes,
wherein the discontinuous regions are positioned opposite at the pads.

8. The solar cell of claim 7, wherein a width of the pads in the longitudinal direction of the first electrodes is equal to or less than a width of the discontinuous regions in the longitudinal direction of the first electrodes.

9. The solar cell of claim 7, wherein each first electrode includes a disconnection portion, in which a first electrode is not formed, and
wherein the discontinuous regions include first discontinuous regions positioned at the pads and second discontinuous regions positioned at the disconnection portions.

10. A solar cell module comprising:
a plurality of solar cells each including a substrate of a first conductive type, a plurality of front surface electrodes positioned on a front surface of the substrate, a plurality of back surface electrodes positioned on a back surface of the substrate; and
a plurality of wiring members configured to connect the plurality of front surface electrodes of a first solar cell among the plurality of solar cells to the plurality of back surface electrodes of a second solar cell adjacent to the first solar cell,
wherein the back surface electrodes include a plurality of first electrodes extending in parallel in a first direction with a first width and a plurality of second electrodes extending in a second direction crossing the first direction and connected to the first electrodes,
a distance between two adjacent first electrodes of the plurality of first electrodes has a first distance,
each of the plurality of second electrodes has a second width,
each of the plurality of solar cells further includes a plurality of first surface field regions doped with impurities of the first conductive type at a concentration higher than the substrate,
a back surface field region is extended in the first direction with a third width wider than the first width, and
a distance between two adjacent first surface field regions of the plurality of first surface field regions has a second distance less than the first distance,
the first surface field regions include discontinuous regions having an impurity concentration lower than an impurity concentration of the first surface field regions,
the discontinuous regions are selectively positioned at crossings of the first electrodes and the second electrodes and extended in the first direction, and
an extended width of the discontinuous regions is greater than the second width of the second electrodes.

11. The solar cell module of claim 10, wherein a plurality of pads are selectively positioned in the discontinuous regions and increase an area of crossings of the plurality of wiring members and the plurality of back surface electrodes.

12. The solar cell module of claim 11, wherein the plurality of back surface electrodes include a plurality of connection electrodes configured to connect the plurality of pads in a longitudinal direction of the wiring members, and
wherein a width of the discontinuous regions positioned correspondingly to the connection electrodes is the same as a width of the discontinuous regions positioned correspondingly to the pads.

13. The solar cell module of claim 11, wherein a number of the discontinuous regions based on one of the plurality of wiring members is equal to or more than a number of the pads based on the one wiring member and is equal to or less than a total number of the back surface electrodes.

14. The solar cell module of claim 10, wherein a total number of the discontinuous regions is equal to or less than a total number of crossings of the back surface electrodes and the wiring members.

15. The solar cell module of claim 10, wherein the plurality of wiring members are divided into wiring members positioned at the discontinuous regions and wiring members, which are not at the discontinuous regions.

16. The solar cell module of claim 10, wherein a ratio of a minimum number of wiring members, which are not at the discontinuous regions, to a total number of wiring members is 0.2 to 0.4.

* * * * *